United States Patent
Hill et al.

[11] Patent Number: 6,002,284
[45] Date of Patent: *Dec. 14, 1999

[54] SPLIT-SLAVE DUAL-PATH D FLIP FLOP

[75] Inventors: Anthony M. Hill, Dallas; Uming Ko, Plano, both of Tex.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/847,460

[22] Filed: Apr. 24, 1997

Related U.S. Application Data

[60] Provisional application No. 60/016,124, Apr. 24, 1996.

[51] Int. Cl.$^6$ .................................................. H03K 3/289
[52] U.S. Cl. ........................................... 327/202; 327/203
[58] Field of Search ............................... 327/199–203, 327/208–212, 218

[56] References Cited

U.S. PATENT DOCUMENTS

| | | | |
|---|---|---|---|
| 4,692,634 | 9/1987 | Fang et al. | 327/203 |
| 5,107,137 | 4/1992 | Kinugasa et al. | 327/203 |
| 5,189,315 | 2/1993 | Akata | 327/212 |
| 5,289,518 | 2/1994 | Nakao | 327/218 |
| 5,497,114 | 3/1996 | Shimozono et al. | 327/212 |
| 5,525,921 | 6/1996 | Callahan | 327/144 |
| 5,612,632 | 3/1997 | Mahant-Shetti et al. | 327/203 |

FOREIGN PATENT DOCUMENTS

| | | | |
|---|---|---|---|
| 5-259834 | 10/1993 | Japan | 327/208 |
| 2174856 | 11/1986 | United Kingdom | 327/203 |

*Primary Examiner*—Tuan T. Lam
*Attorney, Agent, or Firm*—Robert D. Marshall, Jr.; Gerald E. Laws; Richard L. Donaldson

[57] ABSTRACT

A D flip-flop circuit has two current paths supply the output signal of this flip-flop. A push-pull circuit including an inverter and a transmission gate clocked in a first phase supplies the output of the D flip-flop in a first output path. A slave latch connected to the transmission gate having an output clocked in a second phase opposite to the first phase serves as the second path to the output. In one alternative embodiment the master latch includes a transmission gate clocked in the second phase serving as input and a pair of cross coupled inverters serving as latch. The master latch may include a feedback P-type MOSFET. The slave latch may includes two slave latch inverters and a transmission gate clocked in the second phase connected to the output of the D flip-flop output. In a second alternative, an appropriately clocked tri-state inverter replaces the second slave latch inverter and the transmission gate. The master latch and the push-pull circuit may be combined and include two inverters, two transmission gates and a feedback P-type MOSFET. In a third embodiment the push-pull circuit consists of an appropriately clocked tri-state inverter.

4 Claims, 5 Drawing Sheets

SPLIT-SLAVE DUAL-PATH D FLIP FLOP

This application claims priority under 35 U.S.C. 119(e)(1) from U.S. Provisional Patent Application No. 60/016,124 filed Apr. 24, 1996.

CROSS REFERENCE TO RELATED APPLICATION

This application is an improvement over the prior art push-pull isolation D flip-flop with P-type feedback MOSFET of U.S. patent application Ser. No. 08/426,299 filed Apr. 21, 1995.

TECHNICAL FIELD OF THE INVENTION

The technical field of this invention is energy efficient electronic circuits and particularly energy efficient D flip-flop circuits used in control logic in microprocessors.

BACKGROUND OF THE INVENTION

D flip-flops perfrom one of many major functions in finite state machines, which is typically a critical part of control logic. It is known that the control logic of a microprocessor can consume 20% of the processor's power. As more advanced architecture concepts, such as register renaming and out-of-order execution are implemented in a superscalar microprocessors, the control logic will likely become more complicated and its power dissipation will likely grow beyond the current level. In addition, to boost processor clock frequency, modern microprocessors typically adopt superpipelined execution which heavily utilise D flip-flops. Enhancing the speed of D flip-flops can enable a higher clock rate or allow more logic depth between two pipeline registers. These two objectives of low power and high speed provide a need in the art for circuits, such as D flip-flop circuits, which are energy efficient.

SUMMARY OF THE INVENTION

This invention is a D flip-flop circuit. Two independent paths drive the output signal of this flip-flop. In a first embodiment a push-pull circuit includes an inverter having an input connected to the output of a master latch and a transmission gate clocked in a first phase which supplies the output of the D flip-flop. This is the first output path. A slave latch connected to the output of the transmission gate also drives the output during a second phase opposite to the first. The output of the slave latch serves as the second path to the output of the D flip-flop circuit.

In one alternative embodiment the master latch includes a transmission gate clocked in the second phase serving as input and a pair of cross coupled inverters serving as latch. The master latch may include a P-type MOSFET in the feedback path. This feedback P-type MOSFET has its source-drain path connected between the output of a second master latch inverter and the input of a first master latch inverter. Its gate receives a clock signal in the first phase. This P-type MOSFET may be replaced by a transmission gate.

There are two alternatives for the slave latch. In the first alternative, the slave latch includes a first slave latch inverter having an input connected to the output. A second slave latch inverter has an input connected to the output of the first slave latch inverter. A transmission gate clocked in the second phase connects the output of the second slave latch and the D flip-flop output. In a second alternative, an appropriately clocked tri-state inverter replaces the second slave latch inverter and the transmission gate.

In a second embodiment of the invention circuits of the master latch and the push-pull circuit are combined. As combined these circuits include two inverters and two transmission gates. An input first transmission gate is clocked in a first phase. A first master latch inverter has its input connected to the output of the first transmission gate. A second master latch inverter has its input connected to the output of the first master latch. A second transmission gate has input connected to the output of the second master latch inverter and is clocked in a second phase opposite to the first phase. The output of this second transmission gate is one path to the output of the D flip-flop circuit. This feedback P-type MOSFET has its source-drain path connected between the output of the second master latch inverter and the input of the first master latch inverter. Its gate receives a clock signal in the first phase.

In a third embodiment of this invention the push-pull circuit consists of an appropriately clocked tri-state inverter.

BRIEF DESCRIPTION OF THE DRAWINGS

These and other aspects of this invention are illustrated in the drawings, in which.

DETAILED DESCRIPTION OF PREFERRED EMBODIMENTS

Microprocessor integrated circuit design is a compromise among a number of factors. Ideally such circuits should be high performance, use little power and require few transistors. Naturally these goals are contradictory. In the current art circuits are constructed with gates of less than one micron. In this environment the area employed by the transistors is less of a difficulty because the circuit densities are very high. However, the goals of high performance and hence high speed operation is generally inversely related to low power operation. A rough measure of the compromise between these conflicting goals is energy efficiency. One measure of energy efficiency for microprocessor integrated circuits is:

$$E_{IC} = F/P$$

where: $E_{IC}$ is the integrated circuit power efficiency measure; F is the frequency of operation in MHz; and P is the electric power consumed in watts. This measure provides a satisfactory rating for entire integrated circuits, however, it is not well suited for rating individual circuits. One measure of energy efficiency for individual circuits is:

$$E_{circuit} = \frac{1}{D \times P}$$

where: $E_{circuit}$ is the circuit power efficiency measure; D is the circuit delay time in picoseconds; and P is the electric energy consumed in femtojoules. This rating provides a manner for ranking candidate designs when selecting circuit designs for microprocessor integrated circuits.

Figure 1:
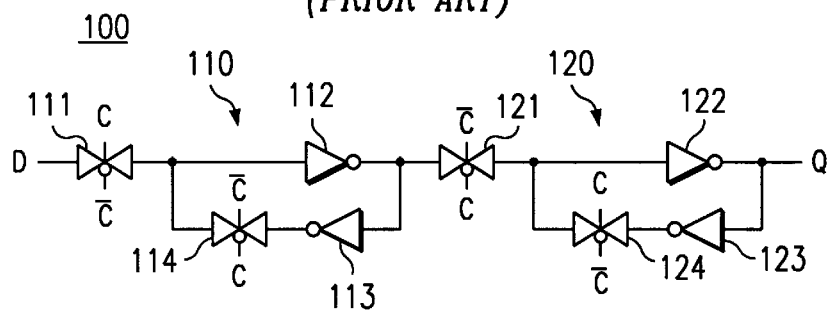
FIG. 1 illustrates in schematic diagram form a common D flip-flop circuit of the prior art.

FIG. 1 illustrates a negative edge-triggered D flip-flop 100 of the prior art. This circuit 100 consists of a master latch 110 and a slave latch 120. Master latch 110 includes an input transmission gate 111, a first inverter 112, a second inverter 113 and a feedback transmission gate 114. The input signal D is supplied to input transmission gate 111 of master latch 110. The output of the master latch supplies the input of the slave latch. The slave latch likewise includes an input transmission gate 121, a first inverter 122, a second inverter 123 and a feedback transmission gate 124. Note that the input transmission gate 111 of master latch 110 is clocked in the opposite phase from the input transmission gate 121 of slave latch 120. Thus these transmission gates conduct on opposite phase of the clock signal C. Inverter 122 of slave latch 120 generates the circuit output signal Q. This circuit illustrated in FIG. 1 can be constructed with 16 MOSFETs. The speed of this regular D flip-flop is limited by a two-gate delay after the clock signal C transitions from logic 1 to 0. This two gate delay includes transmission gate 121 and inverter 122. The advantage of this D flip-flop design is that it involves minimum design risk.

Figure 2:
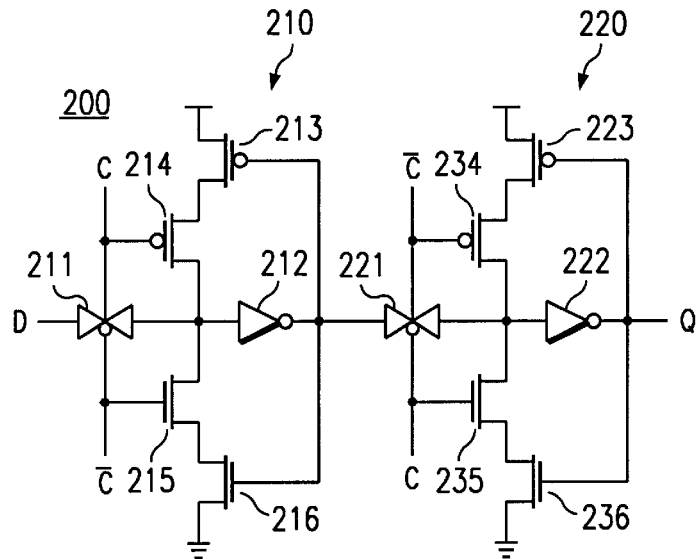
FIG. 2 illustrates in schematic diagram form a common low power D flip-flop circuit of the prior art.

One approach in the prior art to optimize the D flip-flop for power dissipation is to replace the inverter 113 and transmission gate 114 in the feedback path of the master latch 110 with a tri-state inverter. Another tri-state invertor replaces the inverter 123 and the transmission gate 124 in the feedback path of the slave latch. FIG. 2 illustrates this low-power D flip-flop circuit 200. The tri-state inverter in the master latch 210 includes P-type MOSFETs 213 and 214, and N-type MOSFETs 215 and 216. The tri-state inverter in the slave latch 220 includes P-type MOSFETs 223 and 224, and N-type MOSFETs 225 and 226. Low-power D flip-flop circuit 200 can be constructed with 16 MOSFETs, the same number as the regular D flip-flop circuit 100. Only one of MOSFETs 214 or 215 is conductive at one time depending upon the polarity of the clock signal C. Similarly, only one of MOSFETs 224 or 225 is conductive at one time. This avoids short-circuit power dissipation in the feedback path. SPICE circuit simulations indicate that this yields only 1% reduction in total power and 3% slower speed when compared to the regular D flip-flop circuit 100. SPICE circuit simulations indicate that low-power D flip-flop circuit 200 is comparable to the regular D flip-flop circuit 100 in area and energy efficiency.

Figure 3:
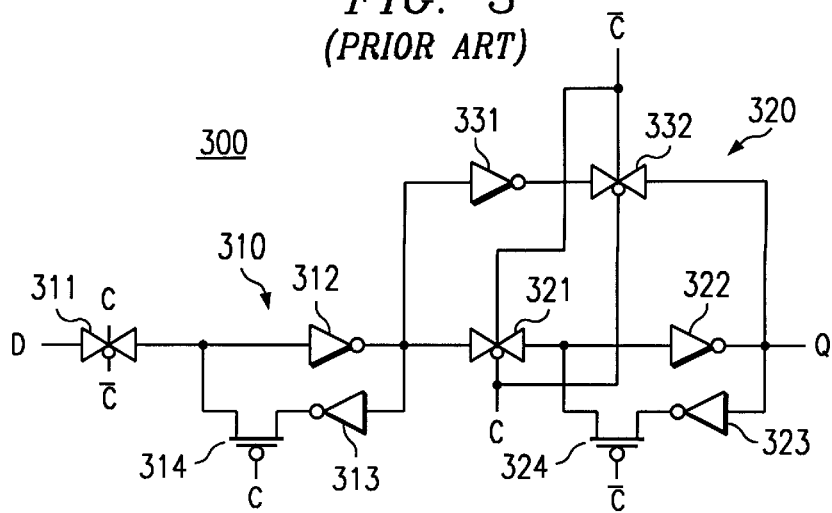
FIG. 3 illustrates in schematic diagram form a push-pull isolation D flip-flop circuit of the prior art.

To optimize for speed, an inverter 331 and a transmission gate 332 are added between outputs of master latch 310 and slave latch 320. This accomplishes a push-pull effect at slave latch 320. This adds four MOSFETs, but reduces the clock-to-output (C-to-Q) delay from two gates in the regular D flip-flop circuit 100 to one gate. This one gate delay includes transmission gate 332. To offset the four added MOSFETs in the push-pull circuit, the transmission gate 114 in master latch feedback path may be replaced by P-type MOSFET 314 and the transmission gate 124 in the slave latch feedback path may be replaced with P-type MOSFET 324, as illustrated in FIG. 3. The source-drain path of MOSFET 314 connects the output of inverter 313 to the input of inverter 312. The gate of MOSFET 314 receives the clock signal. The source-drain path of MOSFET 324 connects the output of inverter 323 to the input of inverter 322. The gate of MOSFET 324 receives the inverse of the clock signal. This push-pull isolation D flip-flop circuit 300 has an increased transistor count of 18, but SPICE circuit simulations indicate that it requires a 6% increase in total power while achieving an increase in speed of 56% relative to the conventional D flip-flop circuit 100. Due to the greater increase in speed than increase in power, push-pull isolation D flip-flop 300 has a higher energy efficiency than regular D flip-flop circuit 100.

Figure 4:
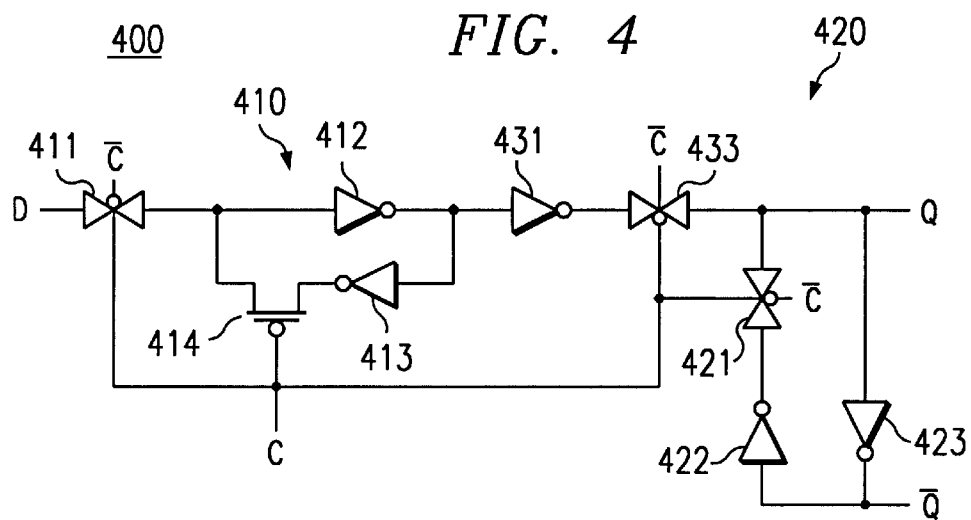
FIG. 4 illustrates in schematic diagram form a split-slave dual-path latch D flip-flop circuit in accordance with this invention.

While the push-pull isolation D flip-flop 300 illustrated in FIG. 3 is approximately 64% faster than the conventional ID flip-flop 100 and the low-power D flip-flop 200, its performance can be further improved. When the output Q begins to switch, a momentary voltage contention exists between the two paths connected to Q from the master latch. When the push-pull path including inverter 331 and transmission gate 332 initially begin to switch high they contend with the output of inverter 322 which is holding the Q output low until it begins to switch. Thus the push-pull isolation D flip-flop 300 provides a momentary DC power dissipation path for the gate delay of inverter 322. By eliminating the lower path and slightly restructuring the slave latch, this voltage contention is eliminated. The resulting split-slave dual-path D flip-flop 400 corresponding to a preferred embodiment of this invention is shown in FIG. 4. The master latch 410 is unchanged from the master latch 310 of the push-pull isolation D flip-flop 300. Split-slave dual-path D flip-flop 400 includes two different paths to the Q output. The first path includes inverter 431 and transmission gate 432. This first path is equivalent to the bypass path of inverter 331 and transmission gate 332 of the push-pull isolation D flip-flop 300. This first path provides essentially the same clock-to-output (C-to-Q) speed as the push-pull isolation D flip-flop 300. The second path to the output Q is via slave latch 420 including transmission gate 421 and inverters 422 and 423. Split-slave dual-path D flip-flop 400 requires 17 MOSFETs, one less than required by push-pull isolation D flip-flop 300. Transmission gate 421 is clocked in the opposite sense from the clocking of transmission gate 432. Thus the slave latch is turned off, eliminating voltage contention with the first path of inverter 431 and transmission gate 432 during initial turn on. This consumes less energy than the push-pull isolation D flip-flop 300. When the clock signal switches, slave latch 420 latches and stores the state at the Q output. This retains the flip-flop state as required. Note that P-type MOSFET 414 may be replaced with a transmission gate such as transmission gate 114 illustrated in FIG. 1.

Figure 5:
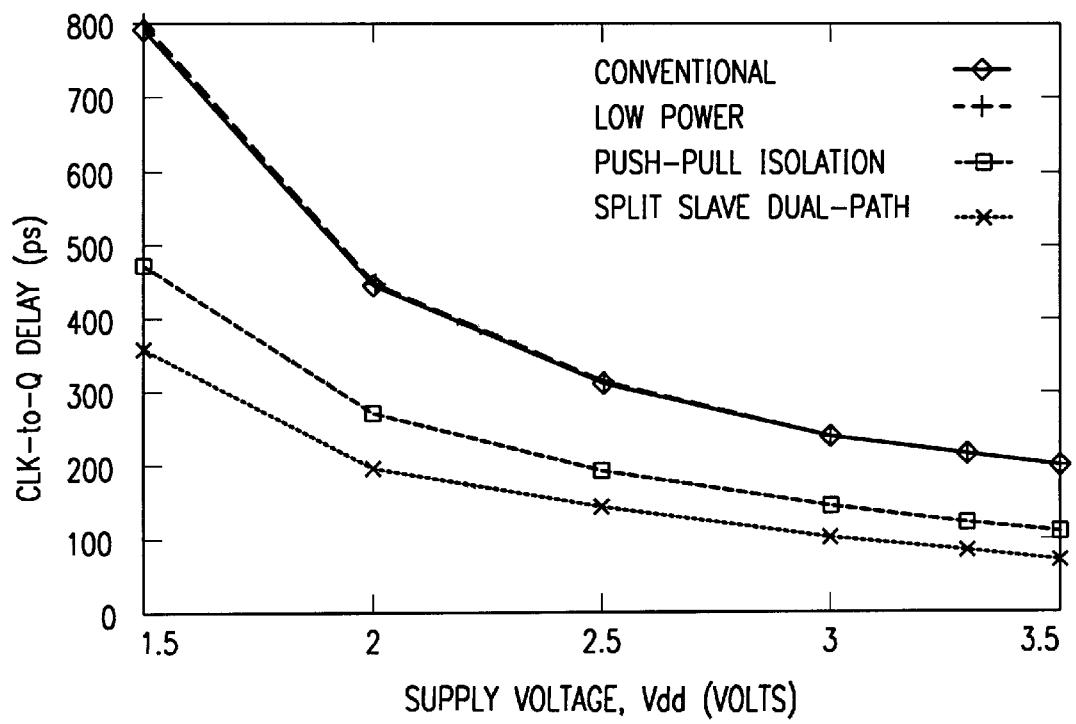
FIG. 5 illustrates a comparison of the delay versus supply voltage for the conventional, low power, push-pull isolation and split-slave dual-path D flip-flops.

FIGS. 5, 6, 7 and 8 illustrate comparisons of the operating characteristics of conventional D flip-flop 100, low power D flip-flop 200, push-pull isolation flip-flop 300 and split-slave dual-path flip-flop 400. The data for FIGS. 5, 6, 7 and 8 come from SPICE circuit simulations. FIG. 5 illustrates the clock-to-Q delay in picoseconds versus power supply voltage in volts from 1.5 volts to 3.5 volts. The clock-to-Q delay for 100 and 200 are essentially the same. The clock-to-Q delay for 300 shows an improvement at all voltages from over 300 pS at 1.5 volts to about 100 pS at 3.5 volts. This improvement is due to the bypass path including inverter 331 and transmission gate 332. The clock-to-Q for 400 shows additional improvement at all voltages from about 100 pS at 1.5 volts to about 25 pS at 3.5 volts. This improvement at all supply voltages is attributed to the elimination of voltage contention upon initial turn on.

Figure 6:
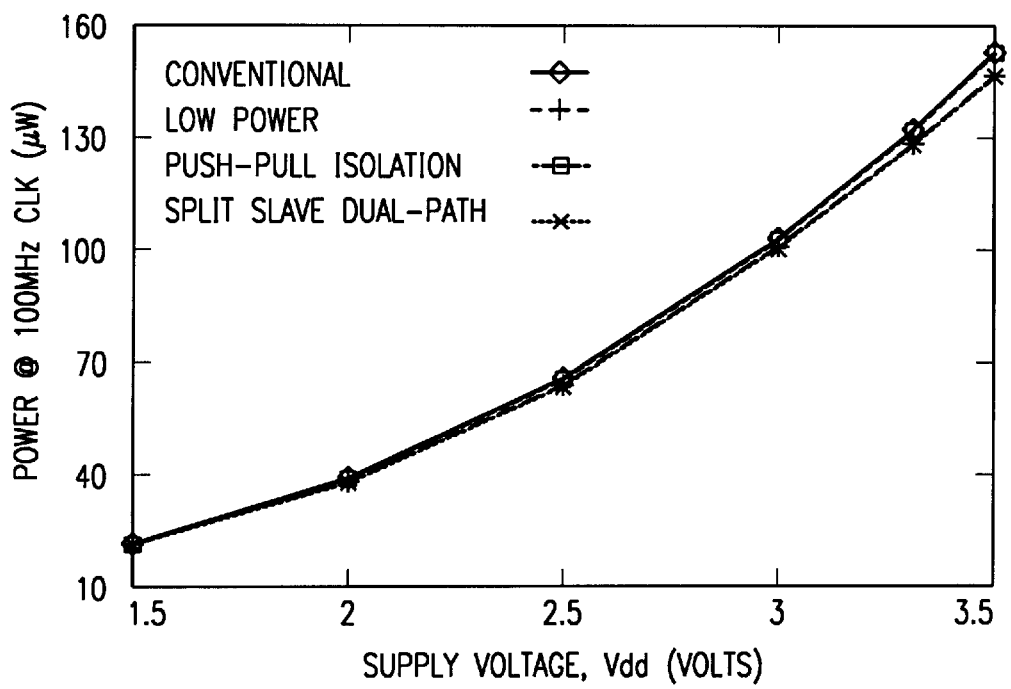
FIG. 6 illustrates a comparison of the power versus supply voltage for the conventional, low power, push-pull isolation and split-slave dual-path D flip-flops.

FIG. 6 illustrates the power dissipation at 100 MHz in microWatts versus power supply voltage in volts from 1.5 volts to 3.5 volts. This set of curves shows little variation between the flip-flop types. The power dissipation of 400 is nearly equal to the power dissipation of 100 and 300 at the lower voltages with 200 dissipating slightly less power. At the higher voltages illustrated in FIG. 6 the power dissipation of 400 is nearly equal to the power dissipation of 200 and slightly less than that of 100 and 300.

Figure 7:
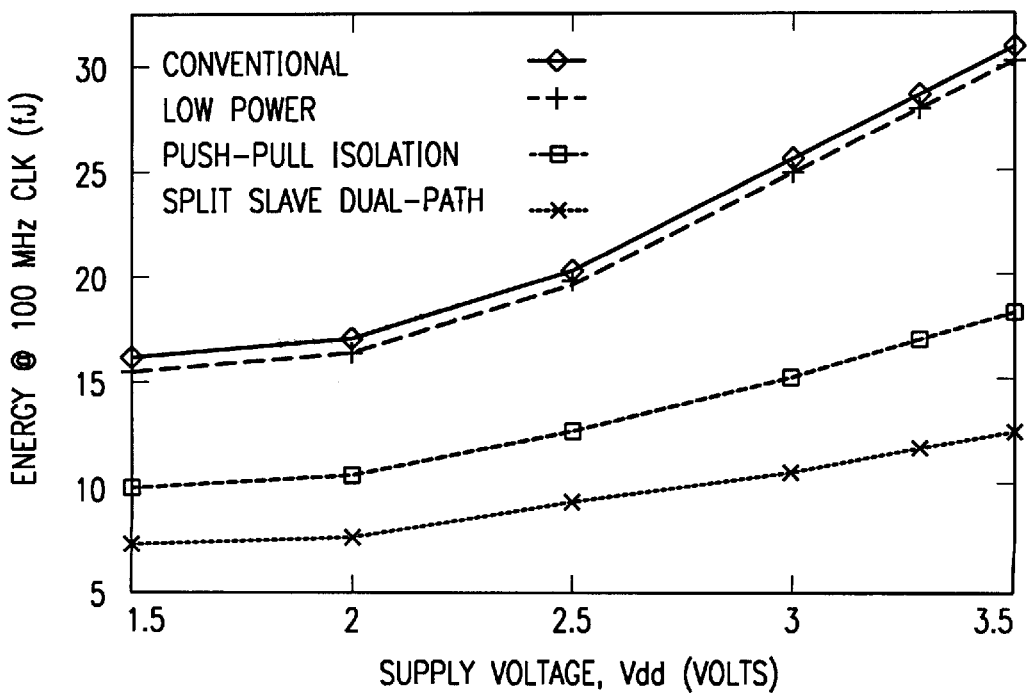
FIG. 7 illustrates a comparison of the energy versus supply voltage for the conventional, low power, push-pull isolation and split-slave dual-path D flip-flops.

FIG. 7 illustrates energy use at 100 MHz in femtoJoules versus power supply voltage in volts from 1.5 volts to 3.5 volts. The 100 and 200 show little difference in this voltage range. The 300 utilizes less energy throughout the entire voltage range from about 6 fJ less at 1.5 volts to about 12 fJ less at 3.5 volts. This better energy efficiency is attributed to the faster clock-to-Q rating of this circuit. The 400 utilizes still less energy throughout the entire voltage range illustrates. It is about 9 fJ less than the 100 and 200 and 4 fJ less than the 300 at 1.5 volts. It grows to about 19 fJ less than 100 and 200 and about 6 fJ less than 300 at 3.5 volts. Thus 400 provides better energy efficiency than prior art circuits for the entire voltage range. This improvement at all supply voltages is attributed to the elimination of voltage contention upon initial turn on.

Figure 8:
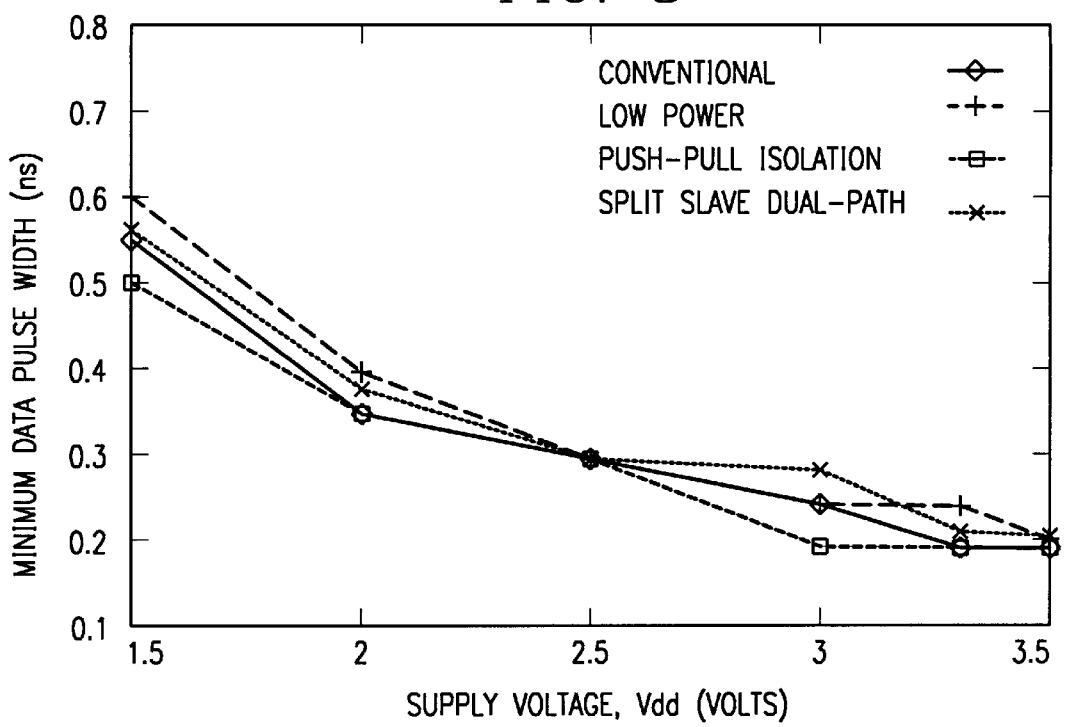
FIG. 8 illustrates a comparison of the minimum data pulse width versus supply voltage for the conventional, low power, push-pull isolation and split-slave dual-path D flip-flops.

FIG. 8 illustrates the minimum data pulse width in nanoseconds versus power supply voltage in volts from 1.5 volts to 3.5 volts. These figures were obtained by adding the flip-flop setup and hold times from SPICE simulations. There is little variation across the voltage range from 1.5 volts to 3.5 volts. The four types of flip-flops behave mostly the same on this measure for this voltage range.

Figure 9:
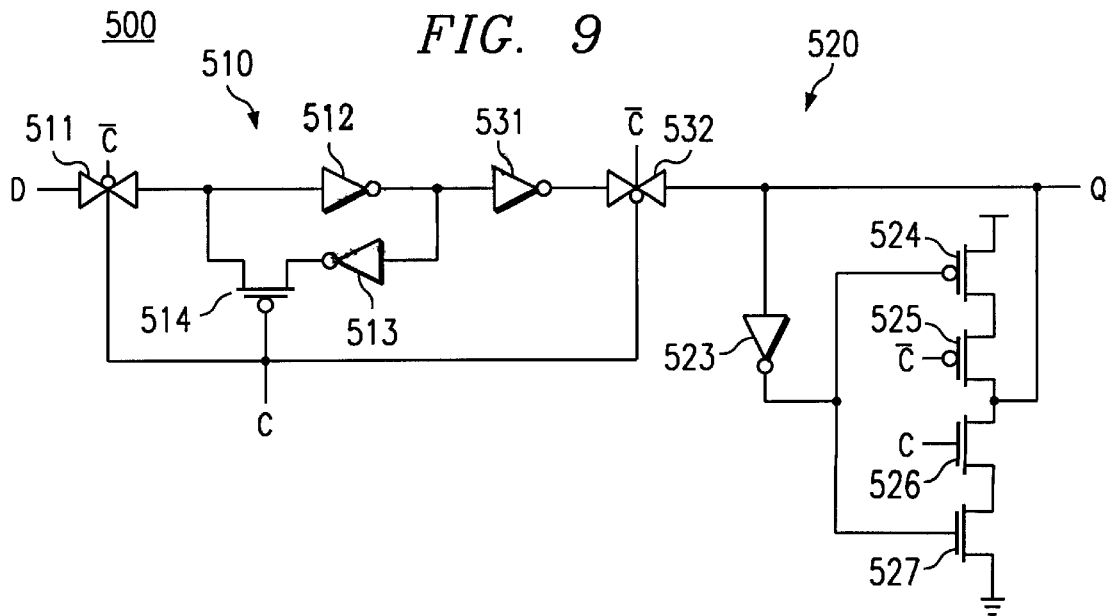
FIG. 9 illustrates an alternative circuit employing a tri-state inverter in the slave latch.

FIG. 9 illustrates a variation in the slave latch circuit. The master latch 510 of tri-state-split-slave dual-path D flip-flop 500 is identical to master latch 410 of split-slave dual-path D flip flop 400. The first path including inverter 531 and transmission gate 532 is unchanged from split-slave dual-path D flip flop 400. A tri-state inverter in slave latch 520 replaces transmission gate 421 and inverter 422 of slave latch 420. The tri-state inverter in the slave latch 520 includes P-type MOSFETs 524 and 525, and N-type MOSFETs 526 and 527. The number of MOSFETs required is unchanged. Since P-type MOSFET 525 and N-type MOSFET 527 are clocked in the opposite phase as transmission gate 532, the tri-state inverter never contends at the output with the signal from transmission gate 532. The performance of tri-state split-slave dual-path D flip-flop 500 is similar to that of split-slave dual-path D flip-flop 400. As previously described, P-type MOSFET 514 may be replaced with a transmission gate such as transmission gate 114 illustrated in FIG. 1.

Figure 10:
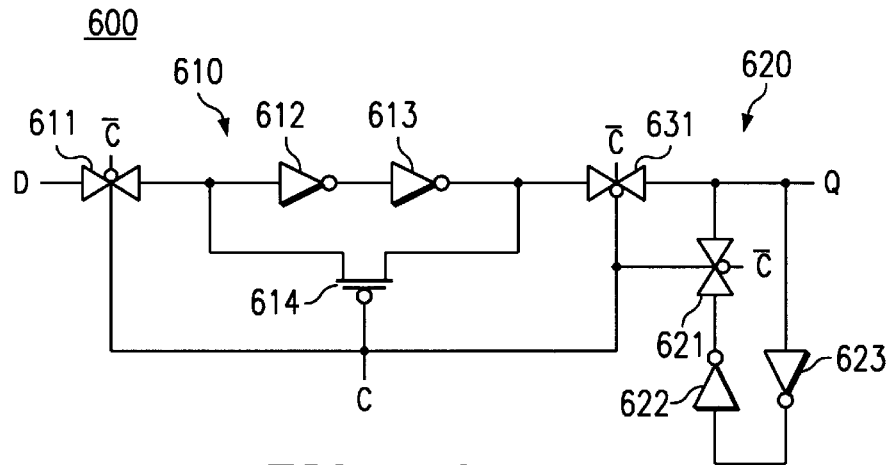
FIG. 10 illustrates an alternative circuit employing a non-isolated master latch.

FIG. 10 illustrates a variation in the master latch circuit. The master latch 610 eliminates one inverter from master latch 410 by combining the functions of inverters 413 and 431. This is achieved by connecting the input of transmission gate 631 to the output of inverter 613 rather than the output of inverter 512 inverted via inverter 531. This circuit is called a non-isolation split-slave dual-path D flip-flop because the master latch 610 is no longer isolated from the Q output by inverter 431 or 531. This circuit require 15 MOSFETs, two less than split-slave dual-path D flip-flop 400 and tri-state split-slave dual-path D flip-flop 500. The performance of non-isolation split-slave dual-path D flip-flop 600 is similar to that of split-slave dual-path D flip-flop 400 and tri-state split-slave dual-path D flip-flop 500 except for a reduction in power usage due to the elimination of one inverter. Note that P-type MOSFET 614 may be replaced with a transmission gate such as transmission gate 114 illustrated in FIG. 1.

Figure 11:
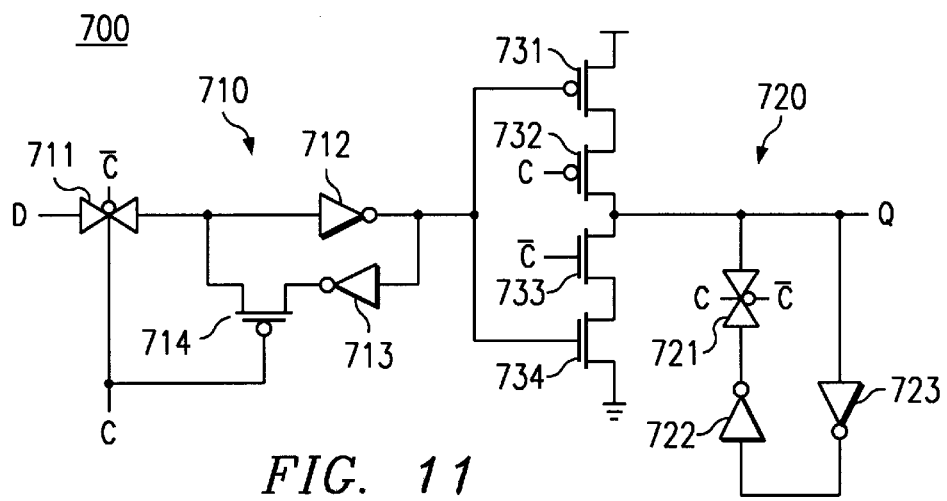
FIG. 11 illustrates an alternative circuit employing a tri-state inverter in the push-pull circuit.

FIG. 11 illustrates a further variation on the split-slave dual-path D flip-flop 400. In FIG. 11 inverter 431 and transmission gate 432 are replaced by an appropriately clocked tri-state inverter. This circuit is called split-slave tri-state dual-path D flip-flop 700. The tri-state inverter in the push-pull circuit includes P-type MOSFETs 731 and 732, and N-type MOSFETs 733 and 734. The number of MOSFETs required is the same as required for split-slave dual-path D flip-flop 400 and -tri-state-split-slave dual-path D flip-flop 500. Since P-type MOSFET 732 and N-type MOSFET 733 are clocked in the opposite phase as transmission gate 721, the tri-state inverter never contends at the output with the signal from transmission gate 721. The performance of tri-state split-slave dual-path D flip-flop 700 is similar to that of split-slave dual-path D flip-flop 400 and tri-state-split-slave dual-path D flip-flop 500. Note that the tri-state inverter in the push-pull circuit as illustrated in FIG. 11 may be combined with a tri-state inverter in the slave latch as illustrated in FIG. 9. The tri-state inverter in the push-pull circuit as illustrated in FIG. 11 may not be combined with alternative master latch circuit 610 illustrated in FIG. 10. The P-type MOSFET 714 needs to be clocked in the opposite phase as the tri-state inverter in FIG. 11. As previously described, P-type MOSFET 714 may be replaced with a transmission gate such as transmission gate 114 illustrated in FIG. 1.

Figure 12:
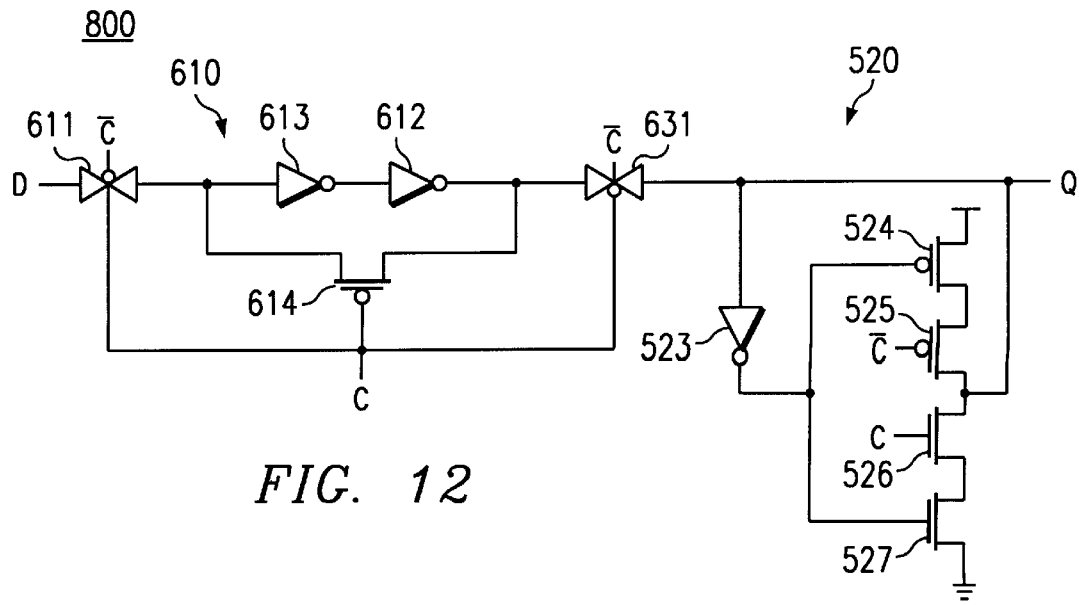
FIG. 12 illustrates a further alternative circuit employing a non-isolated master latch and a tri-state inverter in the slave latch.

FIG. 12 illustrates a further alternative circuit employing a non-isolated master latch 610 as illustrated in FIG. 10 and a tri-state inverter in the slave latch 520 as illustrated in FIG. 9. As noted above, FIG. 9 illustrates substitution of slave latch 520, including a tri-state inverter consisting of P-type MOSFETs 524 and 525, and N-type MOSFETs 526 and 527 for slave latch 420 of FIG. 4. FIG. 12 represents substitution of tri-state slave latch 520 of FIG. 9 for slave latch 620 of FIG. 10, which is identical to slave latch 420.

TABLE 1

| Parameters 3.3 V, 100 MHz | Regular | Low-power | Push-pull Isolation | Split-Slave Dual-Path | Tri-state Split-Slave Dual-Path | Non-Isolated Split-Slave Dual-Path | unit |
|---|---|---|---|---|---|---|---|
| number of transistors | 16 | 16 | 18 | 17 | 17 | 15 | |
| Sum of Transistor widths | 50.6 | 50.6 | 50.0 | 50.1 | 50.1 | 47.3 | $\mu$m |

TABLE 1-continued

| Parameters 3.3 V, 100 MHz | Regular | Low-power | Push-pull Isolation | Split-Slave Dual-Path | Tri-state Split-Slave Dual-Path | Non-Isolated Split-Slave Dual-Path | unit |
|---|---|---|---|---|---|---|---|
| Delay Clock-to-Q | 218.2 | 219.8 | 133.1 | 95.8 | 99.4 | 94.3 | pS |
| percentage | 164 | 165 | 100 | 72 | 75 | 71 | % |
| Power average (D toggled) | 131.7 | 127.5 | 130.5 | 127.0 | 123.2 | 121.9 | µW |
| percentage | 101 | 98 | 100 | 97 | 94 | 93 | % |
| Power average (D constant) | 52.8 | 52.2 | 51.9 | 54.2 | 54.2 | 54.2 | µW |
| percentage | 102 | 103 | 100 | 104 | 104 | 104 | % |
| Energy | 28.7 | 28.0 | 17.4 | 12.2 | 12.2 | 11.5 | fJ |
| percentage | 165 | 161 | 100 | 70 | 70 | 66 | % |

Table I lists some experimental results of the various D flip-flops types. These results are for a supply voltage of 3.3 volts and a clock rate of 100 MHz. For the percentage ratings for Delay Clock-to-Q, Power Average (D toggled), Power Average (D constant) and Energy the push-pull isolation D flip-flop serves as the reference. The values for this type of flip-flop have been arbitrarily set to 100% and the values for other flip-flops adjusted accordingly. As shown in Table I, the split-slave dual-path D flip-flop yields a delay improvement of 28% over the push-pull isolation D flip-flop and a delay improvement of 55% over the conventional and low-power D flip-flop at roughly the same power consumption. Effectively, the split-slave dual-path D flip-flop is 30% more energy efficient the push-pull isolation D flip-flop. The non-isolated spilt-slave dual-path D flip-flop provides the design flexibility to reduce transistor number and total size while still meeting the same performance goals.

What is claimed is:

1. A D flip-flop circuit having an input and an output comprising:
    a master latch including
        a first master transmission gate having an input serving as said input of said D flip-flop circuit and an output, said first transmission gate clocked in a first phase,
        a first master latch inverter having an input connected to said output of said first transmission gate and an output,
        a second master latch inverter having an input connected to said output of said first master latch inverter and an output connected to said input of said first master latch inverter,
        a second master transmission gate having an input connected directly to said output of said second master latch inverter and an output connected directly to said output of said D flip-flop circuit, said second master transmission gate clocked in a second phase opposite to said first phase thereby supplying a signal at said output of said D flip-flop circuit during said second phase; and
    a slave latch having an input connected to said output of said second master transmission gate and an output clocked in said first phase thereby supplying a signal at said output of said D flip-flop circuit during said first phase;
    said slave latch includes
        a first slave latch inverter having an input connected to said output of said second master transmission gate and an output,
        a slave latch tri-state inverter having an input connected to said output of said first slave latch inverter, and output serving as output of said slave latch, said slave latch tri-state inverter being clocked in said first phase.

2. The D flip-flop circuit of claim 1, wherein said slave latch tri-state inverter includes
    a first P-type MOSFET having a source-drain path connected between a supply voltage and a first common terminal and a gate connected to said output of said first slave inverter,
    a second P-type MOSFET having a source-drain path connected between said first common terminal and said output of said slave latch and a gate receiving a clock signal in said first phase,
    a first N-type MOSFET having a source-drain path connected between said output of said slave latch and a second common terminal and a gate receiving said clock signal in said second phase, and
    a second N-type MOSFET having a source-drain path connected between said second common terminal and ground and a gate connected to said output of said first slave latch.

3. A D flip-flop circuit having an input and an output comprising:
    a master latch including
        a first master latch inverter having an input connected to the input of the D flip-flop and an output,
        a second master latch inverter having an input connected to said output of said first master latch inverter and an output connected to said input of said first master latch inverter,
        a master transmission gate having an input connected directly to said output of said second master latch inverter and an output connected directly to said output of said D flip-flop circuit, said master transmission gate clocked in a first phase thereby supplying a signal at said output of said D flip-flop circuit during said first phase; and
    a slave latch having an input connected to said output of said master transmission gate master latch and an output clocked in a second phase opposite to said first phase thereby supplying a signal at said output of said D flip-flop circuit during said second phase;
    said slave latch includes
        a first slave latch inverter having an input connected to said output of said second master transmission gate and an output,
        a slave latch tri-state inverter having an input connected to said output of said first slave latch inverter, and output serving as output of said slave latch, said slave latch tri-state inverter being clocked in said second phase.

4. The D flip-flop circuit of claim 3, wherein
said slave latch tri-state inverter includes
  a first P-type MOSFET having a source-drain path connected between a supply voltage and a first common terminal and a gate connected to said output of said first slave inverter,
  a second P-type MOSFET having a source-drain path connected between said first common terminal and said output of said slave latch and a gate receiving a clock signal in said second phase,
  a first N-type MOSFET having a source-drain path connected between said output of said slave latch and a second common terminal and a gate receiving said clock signal in said first phase, and
  a second N-type MOSFET having a source-drain path connected between said second common terminal and ground and a gate connected to said output of said first slave latch.

* * * * *